(12) United States Patent
Shimono et al.

(10) Patent No.: US 8,755,226 B2
(45) Date of Patent: Jun. 17, 2014

(54) STORAGE DEVICE AND CONTROL METHOD OF NONVOLATILE MEMORY

(71) Applicants: Hitoshi Shimono, Kawasaki (JP); Kazutoshi Noda, Kawasaki (JP); Satoshi Sakamoto, Kawasaki (JP); Akinori Kamizono, Yokohama (JP)

(72) Inventors: Hitoshi Shimono, Kawasaki (JP); Kazutoshi Noda, Kawasaki (JP); Satoshi Sakamoto, Kawasaki (JP); Akinori Kamizono, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 9 days.

(21) Appl. No.: 13/692,106

(22) Filed: Dec. 3, 2012

(65) Prior Publication Data
US 2014/0043900 A1 Feb. 13, 2014

Related U.S. Application Data

(60) Provisional application No. 61/680,605, filed on Aug. 7, 2012.

(51) Int. Cl.
*G11C 16/04* (2006.01)
(52) U.S. Cl.
USPC ............ 365/185.12; 365/185.03; 365/185.33
(58) Field of Classification Search
CPC .......... G11C 11/5628; G11C 11/5642; G11C 16/10; G11C 16/0483; G11C 16/102
USPC ............ 365/185.03, 185.12, 185.17–185.18, 365/185.22, 185.33
See application file for complete search history.

(56) References Cited

U.S. PATENT DOCUMENTS 7,505,320 B2 * 3/2009 Li .............................. 365/185.12
2009/0262577 A1 10/2009 Tanaka

FOREIGN PATENT DOCUMENTS

| JP | 2007-94921 | 4/2007 |
| JP | 2008-158955 | 7/2008 |
| JP | 2009-48750 | 3/2009 |

* cited by examiner

*Primary Examiner* — David Lam
(74) *Attorney, Agent, or Firm* — Oblon, Spivak, McClelland, Maier & Neustadt, L.L.P.

(57) ABSTRACT

According to one embodiment, a storage device includes a nonvolatile memory including physical sectors each of which comprises memory cells commonly connected to a word line, each of the memory cells being capable of storing data of not less than 2 bits, each of the physical sectors including pages corresponding to the number of bits storable in the memory cell, and a controller configured to receive a first write command and to write data associated with the first write command to the nonvolatile memory. In a write process using the first write command, the controller is configured to skip an upper page of a physical sector whose lower page is write-accessed by a second write command prior to the first write command.

19 Claims, 8 Drawing Sheets

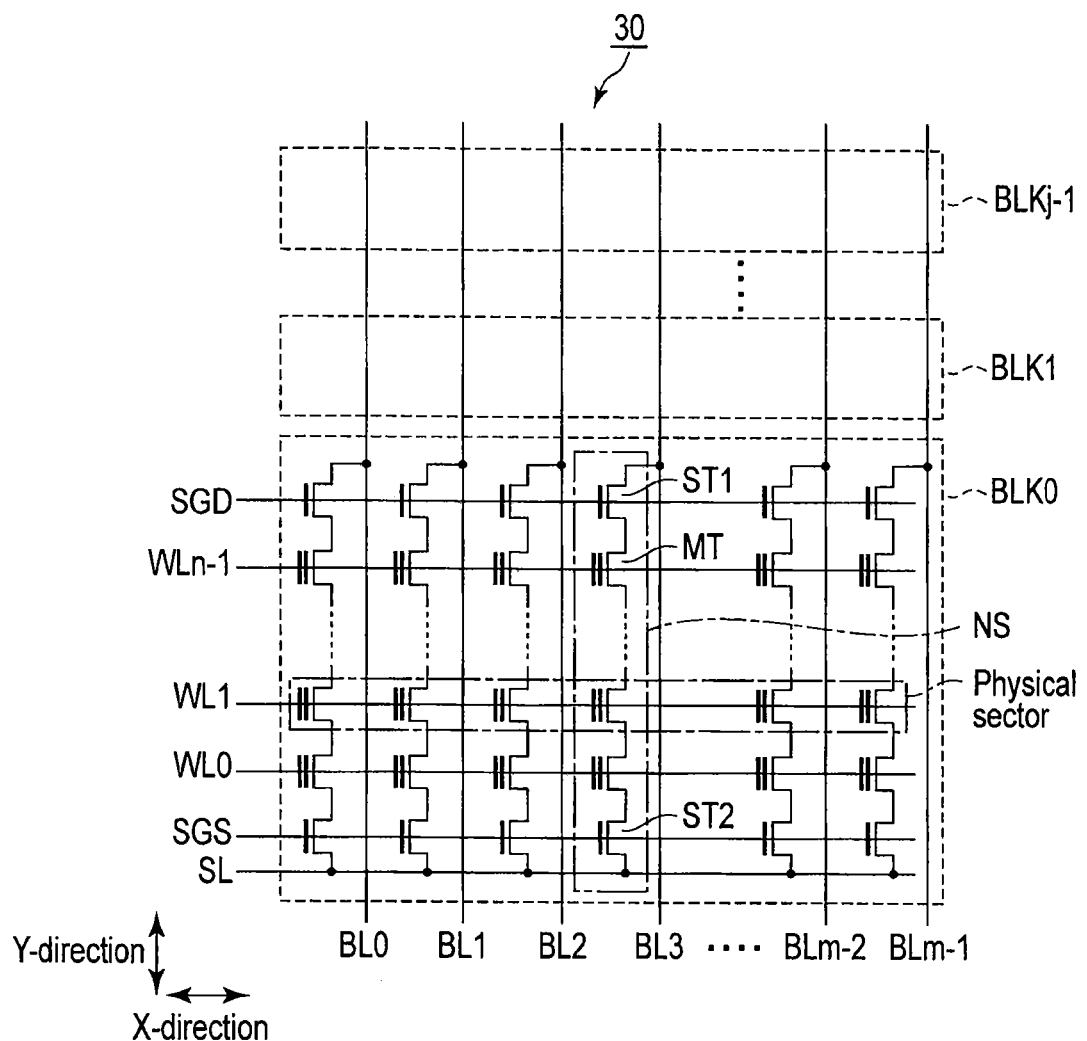
F I G. 2

| L | U | |
|---|---|---|
| 0 | 2 | } Physical sector 0 |
| 1 | 4 | } Physical sector 1 |
| 3 | 6 | |
| 5 | 8 | |
| 7 | 10 | |
| 9 | 12 | |
| ⋮ | ⋮ | |
| 245 | 248 | |
| 247 | 250 | |
| 249 | 252 | |
| 251 | 254 | |
| 253 | 255 | } Physical sector 127 |
F I G. 5
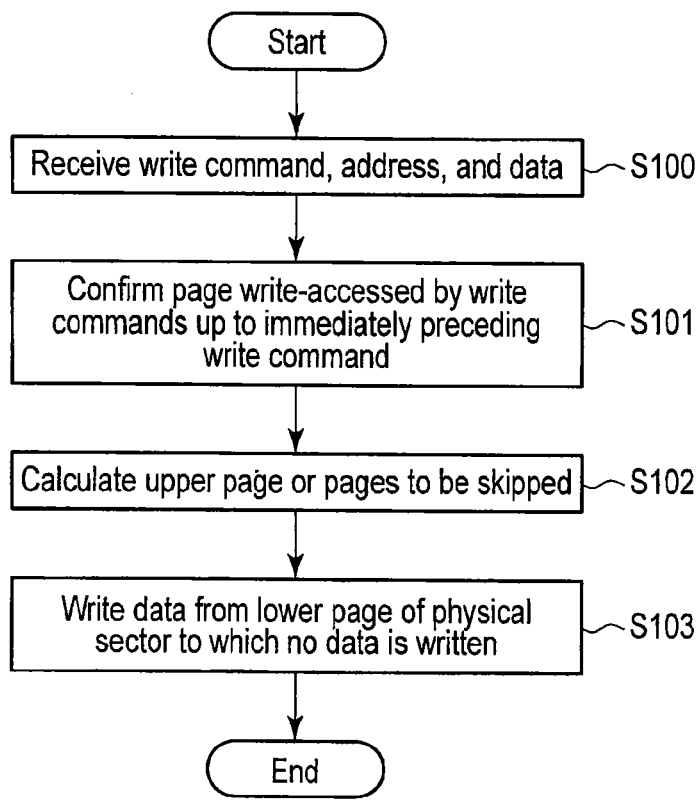
F I G. 6

STORAGE DEVICE AND CONTROL METHOD OF NONVOLATILE MEMORY

CROSS-REFERENCE TO RELATED APPLICATIONS

This application claims the benefit of U.S. Provisional Application No. 61/680,605, filed Aug. 7, 2012, the entire contents of which are incorporated herein by reference.

FIELD

Embodiments described herein relate generally to a storage device and a control method of a nonvolatile memory.

BACKGROUND

A NAND flash memory is known as a kind of electrically programmable nonvolatile storage devices. As a technique for increasing the data storage capacity of the NAND flash memory, an MLC (Multi Level Cell) storage scheme in which the threshold distribution of a memory cell is subdivided to allow storage of a plurality of bits in each memory cell is available.

Data write and read for a NAND flash memory is done using, as a unit, a page formed by memory cells commonly connected to each word line. In the MLC memory, data of a plurality of pages corresponding to the number of bits storable in one memory cell are stored in physically identical memory cells. For example, in a 4-value storage device, two pages share the same memory cell. One of these two pages which has a smaller address is called a lower page, while the other having a larger address is called an upper page.

Upon receiving a write command from a host device, a NAND flash memory may write data to an upper page which shares a memory cell with a lower page to which data is written by another previous write command because the memory writes data from a page next to pages to which data are written by write operations up to the immediately preceding write operation. When the NAND flash memory is powered off during the data write to the upper page, the write access to the upper page by the current write command fails, and at the same time the data previously written to the lower page is also destroyed. This impairs the reliability of the NAND flash memory.

BRIEF DESCRIPTION OF THE DRAWINGS

FIG. 2 is a block diagram showing the arrangement of a memory card according to the first embodiment;

FIG. 5 is a schematic view for explaining physical addresses allocated to a block;

FIG. 6 is a flowchart showing the write operation of the memory card;

FIGS. 7A, 7B, 7C, 7D, 7E, and 7F are views for explaining a detailed write operation;

FIGS. 8A, 8B, 8C, 8D, and 8E are views for explaining another detailed write operation.

DETAILED DESCRIPTION

Figure 1:
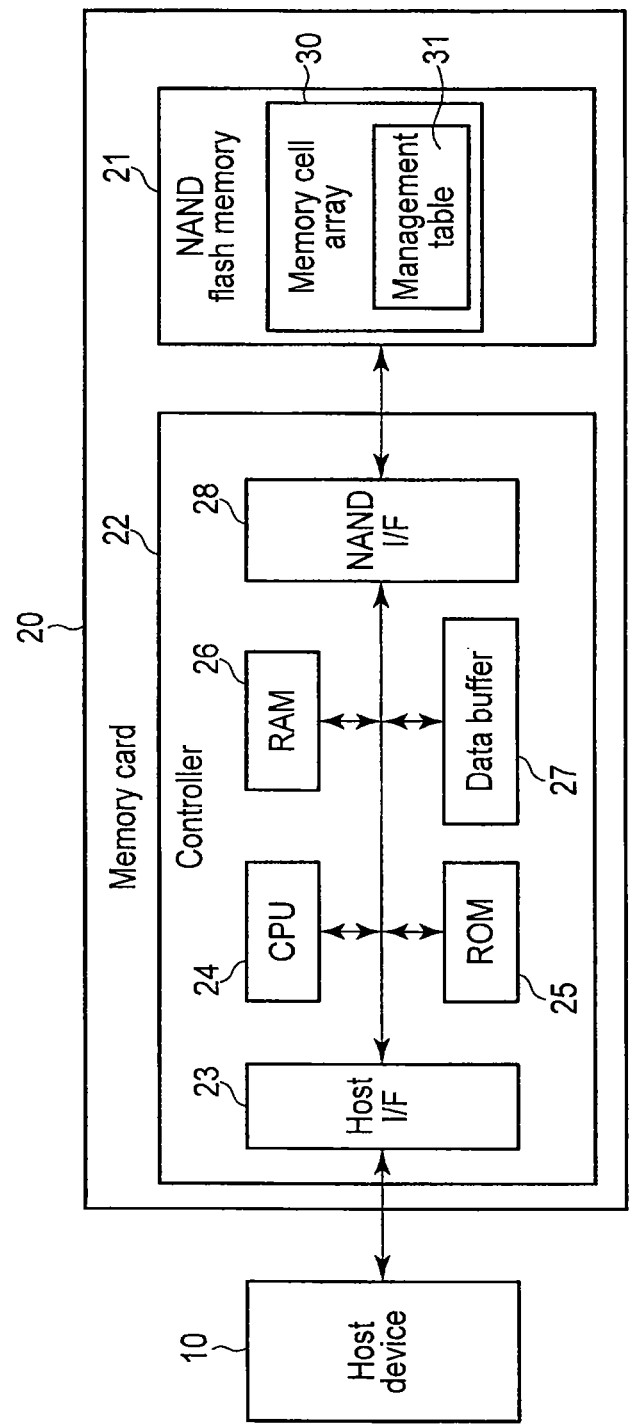
FIG. 1 is a circuit diagram of a memory cell array included in a NAND flash memory.

In general, according to one embodiment, there is provided a storage device comprising:

a nonvolatile memory including physical sectors each of which comprises memory cells commonly connected to a word line, each of the memory cells being capable of storing data of not less than 2 bits, each of the physical sectors including pages corresponding to the number of bits storable in the memory cell, the pages including a lower page and an upper page; and a controller configured to receive a first write command from the outside of the storage device and to write data associated with the first write command to the nonvolatile memory, wherein in a write process using the first write command, the controller is configured to skip an upper page of a physical sector whose lower page is write-accessed by a second write command prior to the first write command.

The preferred embodiments of the present invention will be described with reference to the accompanying drawings. The same reference numerals throughout the drawings denote the same parts and functions, and a detailed description thereof will be made as needed.

First Embodiment

The embodiment will exemplify a NAND flash memory as a nonvolatile semiconductor memory. Various types of memory systems can be considered as a memory system (storage device) including a NAND flash memory. Among these memory systems, the embodiment exemplifies a memory card. The memory card is configured to be detachably mounted in a slot formed in a host device. The memory card operates while being attached to the host device.

1. Arrangement of Memory Card

FIG. 1 is a block diagram showing the arrangement of a memory card 20 according to the first embodiment. The memory card 20 operates upon receiving power when it is connected to a host device 10. The memory card 20 executes processing in accordance with an access request from the host device 10. The host device 10 includes hardware and software which access the memory card 20 connected via an interface. The host device 10 includes a power supply circuit for supplying power to the memory card 20.

The memory card 20 exchanges data with the host device 10 via an interface. The memory card 20 includes a NAND flash memory 21 and a controller 22.

The controller 22 manages the physical state of data stored in the NAND flash memory 21 and controls the NAND flash memory 21 in response to a request from the host device 10. The controller 22 includes a host interface (host I/F) 23, CPU 24, ROM 25, RAM 26, data buffer 27, and NAND interface (NAND I/F) 28. For example, these components are connected to each other via a bus.

The host interface 23 interfaces between the controller 22 and the host device 10. The NAND interface 28 interfaces between the controller 22 and the NAND flash memory 21.

The ROM 25 stores firmware and the like used by the CPU 24. The RAM 26 is used as the work area of the CPU 24 and stores the firmware loaded from the ROM 25 and various types of tables generated by the CPU 24.

The CPU 24 controls the overall operation of the memory card 20. When the memory card 20 receives power from the host device 10, the CPU 24 executes predetermined processing upon reading the firmware stored in the ROM 25 and the NAND flash memory 21. The CPU 24 also generates various types of tables on the RAM 26 using the data read from the NAND flash memory 21. The CPU 24 then executes predetermined processing using these tables. The CPU 24 receives a write command, read command, and erase command from the host device 10 and executes write, read, and erase operations for the NAND flash memory 21.

The data buffer 27 temporarily stores a predetermined amount of data when writing data sent from the host device 10 to the NAND flash memory 21. The data buffer 27 also temporarily stores a predetermined amount of data when sending the data read from the NAND flash memory 21 to the host device 10.

The NAND flash memory 21 includes a memory cell array 30 and various types of circuits (not shown) which perform data write, read and erase operations with respect to the memory cell array 30. FIG. 2 is a circuit diagram of the memory cell array 30 included in the NAND flash memory 21.

The memory cell array 30 includes one or a plurality of blocks BLK. FIG. 2 shows j blocks BLK0 to BLKj−1 (j is an integer of one or more). Each block BLK includes one or a plurality of NAND strings NS. FIG. 2 shows m NAND strings NS (m is an integer of one or more) arranged along the X-direction. A selection transistor ST1 included in each NAND string NS has a drain connected to a bit line BL and a gate connected to a selection gate line SGD. A selection transistor ST2 included in each NAND string NS has a source connected to a source line SL and a gate connected to a selection gate line SGS.

Each memory cell transistor MT is formed on a p-type well and formed from a MOSFET (Metal Oxide Semiconductor Field Effect Transistor) including a stacked gate having a charge storage layer. The stacked gate of each memory cell transistor MT includes a charge storage layer formed on a gate insulating film on the p-type well and a control gate formed on an insulating film on the charge storage layer. The threshold voltage of each memory cell transistor MT changes in accordance with the number of electrons stored in the charge storage layer. Each memory transistor MT stores data in accordance with a change in threshold voltage.

In each NAND string NS, n (n is an integer of one or more) memory cell transistors are arranged such that their current paths are connected in series with each other between the source of the selection transistor ST1 and the drain of the selection transistor ST2. In each NAND string NS, the memory cell transistors MT are respectively connected to word lines WL0 to WLn−1 in an order from the memory cell transistor MT located nearest to the source side. Therefore, the drain of the memory cell transistor MT connected to the word line WLn−1 is connected to the source of the selection transistor ST1, and the source of the memory cell transistor MT connected to the word line WL0 is connected to the drain of the selection transistor ST2.

Each of the word lines WL0 to WLn−1 commonly connects the control gates of the corresponding memory cell transistors MT between the corresponding NAND strings NS in each block BLK. That is, the control gates of the memory cell transistors MT on the same row in the block BLK are connected to the corresponding word line WL. The m memory cell transistors MT connected to the same word line WL are called a physical sector.

Each memory transistor MT can store multi level data, for example, 2-bit data. In this case, each physical sector is configured by two pages, that is, a lower page corresponding to the lower bit of the 2-bit data and an upper page corresponding to the upper bit of the 2-bit data. Data write and read are performed for each page at once. The memory cell array 30 is configured such that the data of a plurality of physical sectors are erased at once. The unit of erase is the block BLK.

Each of the bit lines BL0 to BLm−1 commonly connects the drains of the corresponding selection transistors ST1 between the corresponding blocks BLK. More specifically, the NAND strings on the same column in each of the blocks BLK0 to BLKj−1 are connected to the corresponding bit line BL.

Figure 3A:
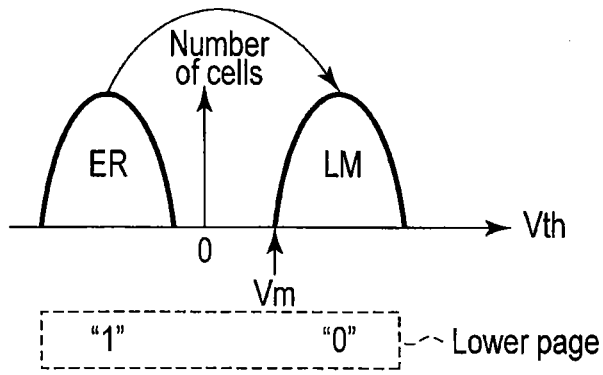
FIGS. 3A and 3B are views for explaining the relationship between the threshold distribution and data of a memory cell transistor.
Figure 3B:
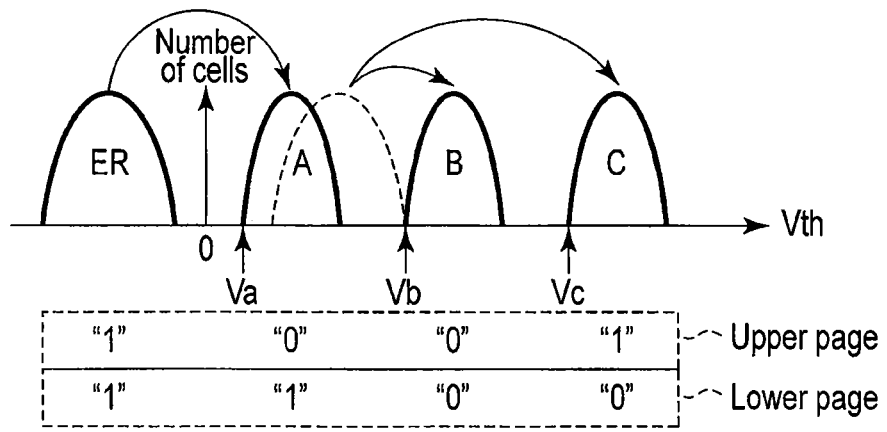

FIGS. 3A and 3B are views for explaining the relationship between the threshold distribution and data of the memory cell transistors MT. Threshold voltages Vth of the memory cell transistors are plotted along the abscissa in each of FIGS. 3A and 3B, and the number of memory cell transistors (cell count) is plotted along the ordinate in each of FIGS. 3A and 3B.

The 2-bit data stored in one memory cell transistor MT is formed from the lower page data and the upper page data. The lower page data and the upper page data are written to the memory cell transistor MT by independent write operations, that is, two write operations. As shown in FIGS. 3A and 3B, when writing 2-bit data to the memory cell transistor MT, lower page write for writing the lower bit data and upper page write for writing the upper bit data are performed. When the data is given as "XY", "X" represents the upper page data, and "Y" represents the lower page data.

Four threshold voltages corresponding to the 2-bit data are called an ER level, A level, B level, and C level in the ascending order. When data in the block BLK are erased at once, the threshold voltage of each memory cell transistor is set to the ER level (erase state). The ER level of the erase state is set as, for example, a negative voltage.

The lower page write operation allows to store, in the memory cell transistor MT, one of "1" data whose threshold voltage is the ER level and "0" data whose threshold voltage is an intermediate level (LM level) higher than the RE level. When writing "1" data to the memory cell transistor MT, the threshold voltage of the memory cell transistor MT is not shifted. When writing "0" data to the memory cell transistor MT, the threshold voltage of the memory cell transistor MT is shifted to the positive side. "0" data write is done using a verify voltage Vm. The verify voltage is a voltage applied to the selected word line to confirm whether the write access is completed. That is, the lower limit value of the threshold voltage distribution of the LM level is determined by the verify voltage Vm.

Subsequently, the upper page write operation allows to set the threshold voltage of the memory cell transistor MT to one of the ER level, A level, B level, and C level. The ER level, A level, B level, and C level correspond to "11" data, "01" data, "00" data, and "10" data, respectively. The relationship between the threshold voltages and data of the memory cell transistor MT can be arbitrarily set.

The "11" data represents the threshold level of the erase state (ER level). That is, to write "11" data to the memory cell transistor MT, the threshold voltage of the memory cell transistor MT is not shifted. To write one of the A level, B level, and C level to the memory cell transistor MT, the threshold voltage of the memory cell transistor MT is shifted to the positive side. Write operations of the A level, B level, and C level are done using verify voltages Va, Vb, and Vc, respectively.

Figure 4:
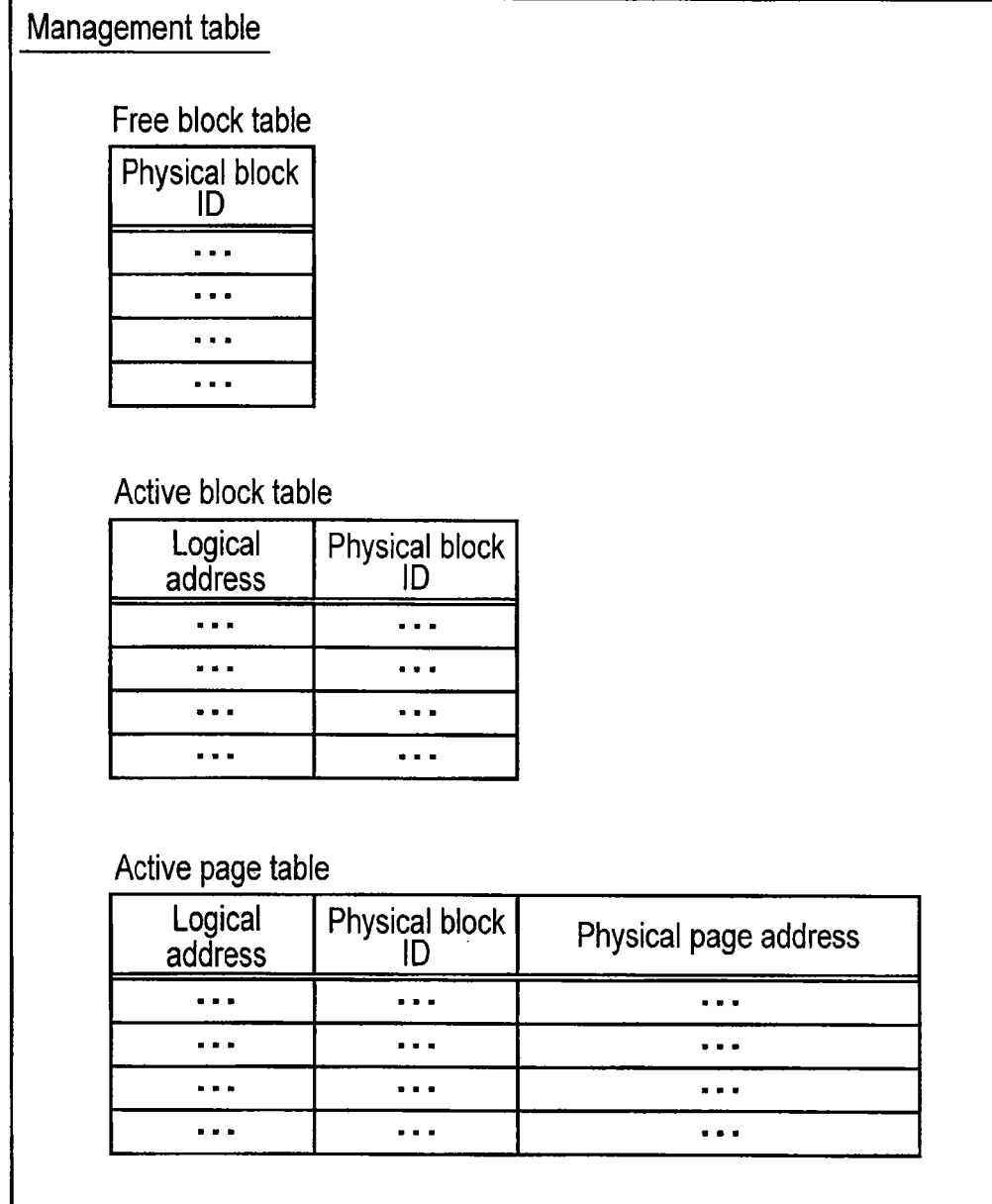
FIG. 4 is a view showing part of a management table stored in the NAND flash memory.

FIG. 4 is a view for explaining part of a management table 31 stored in the NAND flash memory 21. During activation of the memory card 20, the management table 31 is read from the NAND flash memory 21 to the RAM 26. The CPU 24 operates by looking up the management table 31 in the RAM 26.

When the host device 10 transmits an instruction to the memory card 20, the instruction is sent to the controller 22. The controller 22 processes the received instruction. In this case, the controller 22 looks up the management table 31 in the RAM 26 to convert a logical address received from the host device 10 into a physical address as needed. The logical address is an address managed by the host device 10. The physical address is a real address managed by the memory card 20.

As shown in FIG. 4, the management table 31 includes a free block table, active block table, and active page table. The physical address includes a physical block ID and physical page address. The physical block table manages the physical block ID and the logical address linked with each other. A physical block (active block) registered in the active block table holds data valid for at least the controller 22. The free block table manages a physical block not linked with the logical address. The physical block (free block) registered in the free block table is not linked with the logical address and does not hold any valid data.

The active page table manages the physical page address and the logical address linked with each other. The physical page (active page) registered in the active page table holds data valid for at least the controller 22. The physical page registered in the active page table is associated with the physical block ID to which the physical page belongs.

2. Operation of Memory Card

The operation of the memory card 20 configured as described above will be described below. The NAND flash memory executes a write process for each page. Data cannot be overwritten physically on an already write-accessed page in the NAND flash memory. To write data to the block BLK, the data is added based on the physical page address. FIG. 5 is a schematic view for explaining the physical page addresses allocated to the block BLK.

Referring to FIG. 5, one rectangle indicates one page. "L" indicates the lower page, and "U" indicates the upper page. More specifically, one row of "L" indicates all lower pages, while one row of "U" indicates all upper pages. Two pages (lower and upper pages) aligned in the horizontal direction indicate one physical sector formed from memory cells connected to one word line.

Numerical values in FIG. 5 indicate physical page addresses, respectively. One block BLK includes, for example, 128 physical sectors (physical sector 0 to physical sector 127), that is, 256 pages (page 0 to page 255). When writing data continuously to a plurality of pages, write access is done in accordance with the order of the physical page addresses. More specifically, data is written first to the start page (page 0) in the block BLK, and data is written last to the last page (page 255). Write for pages (page 1 to page 254) between the start and last pages is done using a rule such that after data is written to the lower page of an arbitrary first physical sector, data is written to the upper page of the second physical sector (data is already written to its lower page) immediately preceding the first physical sector.

When micropatterning of memory cell transistors advances, capacitive coupling between memory cell transistors connected to the adjacent word lines becomes conspicuous. In this case, when data is written to one of the adjacent memory cell transistors, the threshold of the other memory cell transistor may shift. To prevent threshold variations caused by this capacitive coupling, data is written to the lower page of the first physical sector adjacent to the second physical sector before data is written to the upper page of the second physical sector.

The write operation of the memory card 20 will be described next. FIG. 6 is a flowchart showing the write operation of the memory card 20.

The controller 22 receives a write command, address, and write data from the host device 10 (step S100). The controller 22 interprets the write command from the host device 10. Subsequently, the controller 22 looks up the management table 31 loaded in the RAM 26 to confirm pages write-accessed by the immediately preceding write command or write commands up to the immediately preceding write command (the write command prior to the current write command) (step S101).

The controller 22 then calculates the number of upper pages to be skipped for the write process by the current write command (step S102). More specifically, the controller 22 calculates an upper page or upper pages of the physical sector or sectors to which data are not written by the immediately preceding write command or write commands up to the immediately preceding write command.

The controller 22 skips the upper page or pages calculated in step S102 and write data indicated by the current write command from the lower page of a physical sector to which no data is written (step S103). According to the embodiment, the physical sector next to the last physical sector out of the physical sectors including a page write-accessed by write commands up to the immediately preceding write command is selected as the physical sector to be write-accessed by the current write command. In other words, the start physical sector out of physical sectors to which no data are written by write commands up to the immediately preceding write command is selected.

Even if the memory card 20 is powered off during write access using the current write command, the data written by the immediately preceding write command or write commands up to the immediately preceding write command will not be destroyed. According to the embodiment, data is written by the current write command to a page in which the data written by the write commands up to the immediately preceding write command are not affected. The data by the current write command need not necessarily be written to the physical sector next to the last physical sector to which data are written by the write commands up to the immediately preceding write command. The data by the current write command may be written by skipping one or a plurality of physical sectors.

3. Example

A more practical example will now be described below with reference to the accompanying drawings. First, the write operation near the start page of the block BLK will be described.

Figures 7A, 7B, 7C, 7D, 7E, 7F:
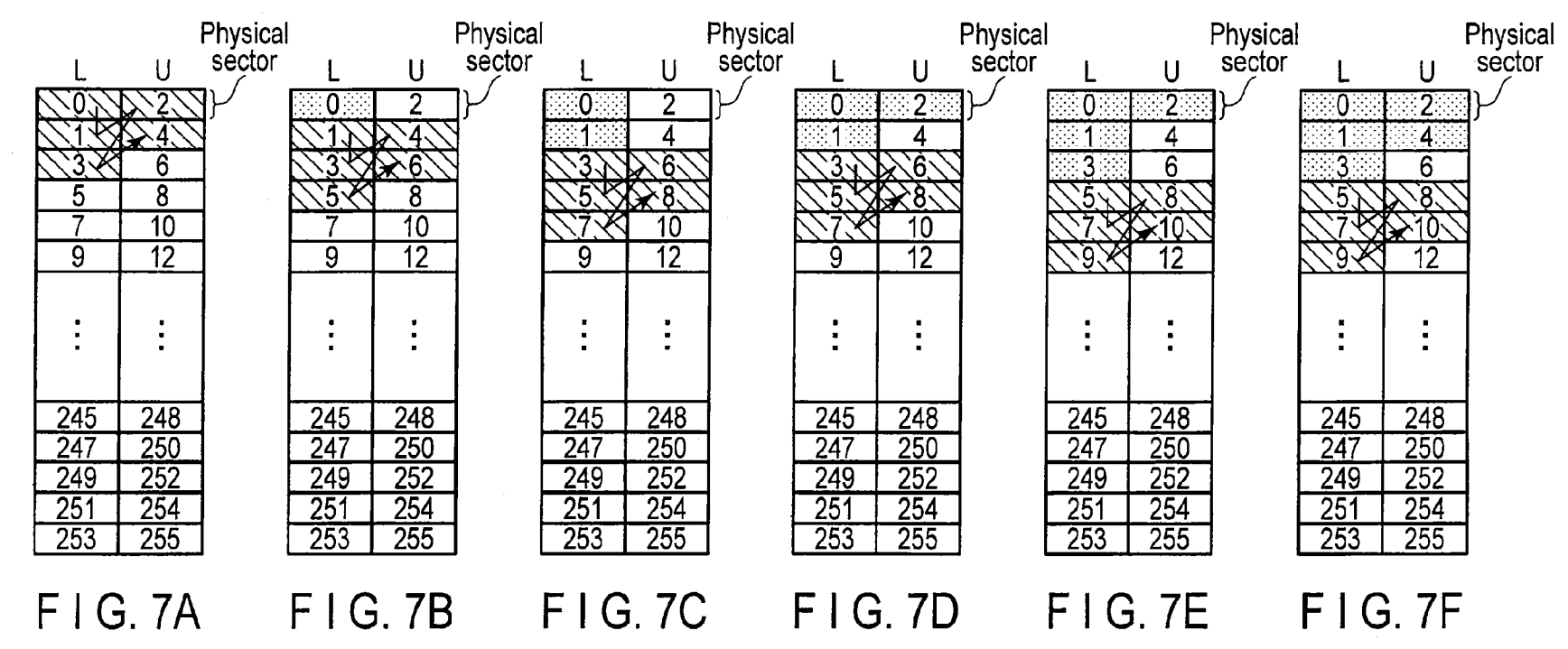

FIG. 7A is a view for explaining the write operation of the erased block BLK, that is, the block to which no data is written. A hatched region in FIG. 7A indicates pages to be write-accessed by the current write command. When writing data from page 0, data is written to the block BLK in the same order as the physical page address. In the example of FIG. 7A, data are written to page 0 to page 4.

FIG. 7B is a view for explaining the write operation when data is already written to page 0 by the immediately preceding write command. The dotted region in FIG. 7B indicates a page to which data is already written by the immediately preceding write command. In the example of FIG. 7B, an upper page (page 2), to which data is not written, out of the physical sectors including a page write-accessed by the immediately preceding write command is skipped. The data is written from the lower page (page 1) of the physical sector to which no data is written. In this case, the write operation is performed in the order of page 1, page 3, page 4, page 5, and page 6.

FIG. 7C is a view for explaining the write operation when data are already written to page 0 and page 1 by the immediately preceding write command. In the example of FIG. 7C, out of the physical sectors including pages write-accessed by the immediately preceding write command, upper pages (page 2 and page 4) to which no data are written are skipped. The data is written from the lower page (page 3) of the physical sector to which no data is written. In this case, the write operation is performed in the order of page 3, page 5, page 6, page 7, and page 8.

FIG. 7D is a view for explaining the write operation when data are already written to page 0 to page 2 by the immediately preceding write command. In the example of FIG. 7D, out of the physical sectors including pages write-accessed by the immediately preceding write command, an upper page (page 4) to which no data is written is skipped. The data is written from the lower page (page 3) of the physical sector to which no data is written.

FIG. 7E is a view for explaining the write operation when data are already written to page 0 to page 3 by the immediately preceding write command. In the example of FIG. 7E, out of the physical sectors including pages write-accessed by the immediately preceding write command, upper pages (page 4 and page 6) to which no data are written are skipped. The data is written from the lower page (page 5) of the physical sector to which no data is written. In this case, the write operation is performed in the order of page 5, page 7, page 8, page 9, and page 10.

FIG. 7F is a view for explaining the write operation when data are written to page 0 to page 4 by the immediately preceding write command. In the example of FIG. 7F, out of the physical sectors including the pages write-accessed by the immediately preceding write command, an upper page (page 6) to which no data is written is skipped. The data is written from the lower page (page 5) of the physical sector to which no data is written.

The write operation near the last page of the block BLK will be described next.

Figures 8A, 8B, 8C, 8D, 8E:
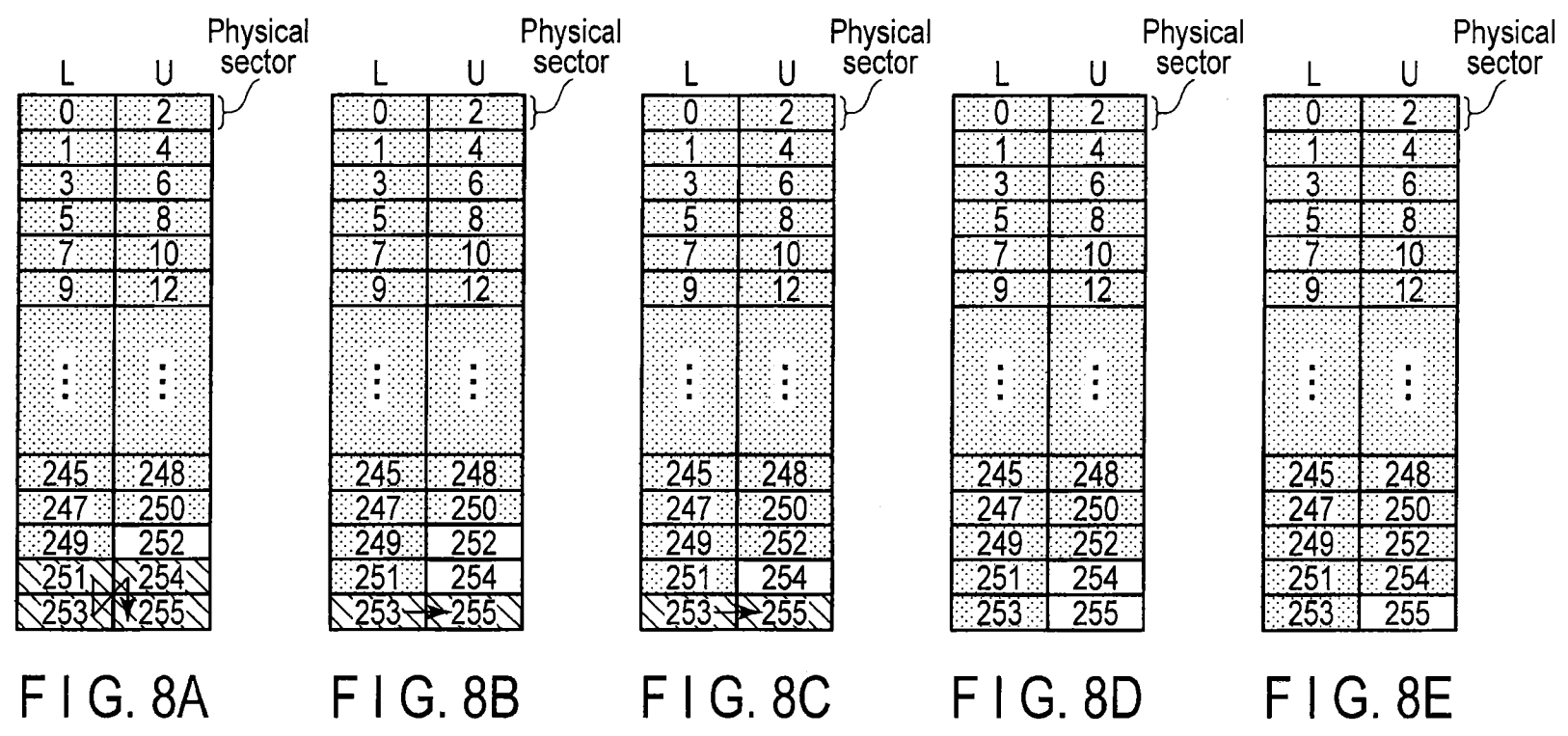

FIG. 8A is a view for explaining the write operation when data are already written up to page 250 by write commands up to the immediately preceding write command. In the example of FIG. 8A, out of the physical sectors including pages to which the data are already written by the write commands up to the immediately preceding write command, an upper page (page 252) to which no data is written is skipped. The data is written from the lower page (page 251) of the physical sector to which no data is written. In this case, the write operation is performed in the order of page 251, page 253, page 254, and page 255.

FIG. 8B is a view for explaining the write operation when data is already written up to page 251 by write commands up to the immediately preceding write command. In the example of FIG. 8B, out of the physical sectors including pages to which the data are already written by the write commands up to the immediately preceding write command, upper pages (page 252 and page 254) to which no data is written are skipped. The data is written from the lower page (page 253) of the physical sector to which no data is written. In this case, the write operation is performed in the order of page 253 and page 255.

FIG. 8C is a view for explaining the write operation when data is already written up to page 252 by write commands up to the immediately preceding write command. In the example of FIG. 8C, out of the physical sectors including pages to which the data are already written by the write commands up to the immediately preceding write command, an upper page (page 254) to which no data is written are skipped. The data is written from the lower page (page 253) of the physical sector to which no data is written.

FIG. 8D is a view for explaining the write operation when data is already written up to page 253 by write commands up to the immediately preceding write command. In the example of FIG. 8D, out of the physical sectors including pages to which the data are already written by the write commands up to the immediately preceding write command, upper pages (page 254 and page 255) to which no data is written are skipped. For this reason, no data is written to the corresponding block. Data by the current write command is written in a new erased block.

FIG. 8E is a view for explaining the write operation when data is already written up to page 254 by write commands up to the immediately preceding write command. In the example of FIG. 8E, out of the physical sectors including pages to which the data are already written by the write commands up to the immediately preceding write command, an upper page (page 255) to which no data is written are skipped. For this reason, no data is written to the corresponding block. Data by the current write command is written in a new erased block.

4. Effect

As described above in detail, according to the first embodiment, the memory card (storage device) 20 includes the NAND flash memory (nonvolatile memory) 21 and the controller 22. The NAND flash memory 21 can erase data for each block BLK. Each block BLK includes a plurality of physical sectors configured by memory cells commonly connected to each word line. Each physical sector includes a plurality of pages (including the lower and upper pages) corresponding to the number of bits storable in each memory cell. In the write process using the current write command, the controller 22 is configured to skip the upper page of the physical sector whose lower page is write-accessed by the immediately preceding write command or the write commands up to the immediately preceding write command (in other words, the write command prior to the current write command).

According to the first embodiment, even if the memory card 20 is powered off during data write to the NAND flash memory 21, data previously written by another write command will not be destroyed. This makes it possible to improve the reliability of the data written to the memory card 20.

Second Embodiment

According to the second embodiment, in the write process using the current write command, it is determined whether logical addresses associated with the immediately preceding write command or write commands up to the immediately preceding write command are continuous with logical addresses associated with the current write command. When the logical addresses associated with the immediately preceding write command or the write commands up to the immediately preceding write command are continuous with the logical addresses associated with the current write command, the data by the current write command is written in accordance with the physical page address order, unlike in the first embodiment.

Figure 9:
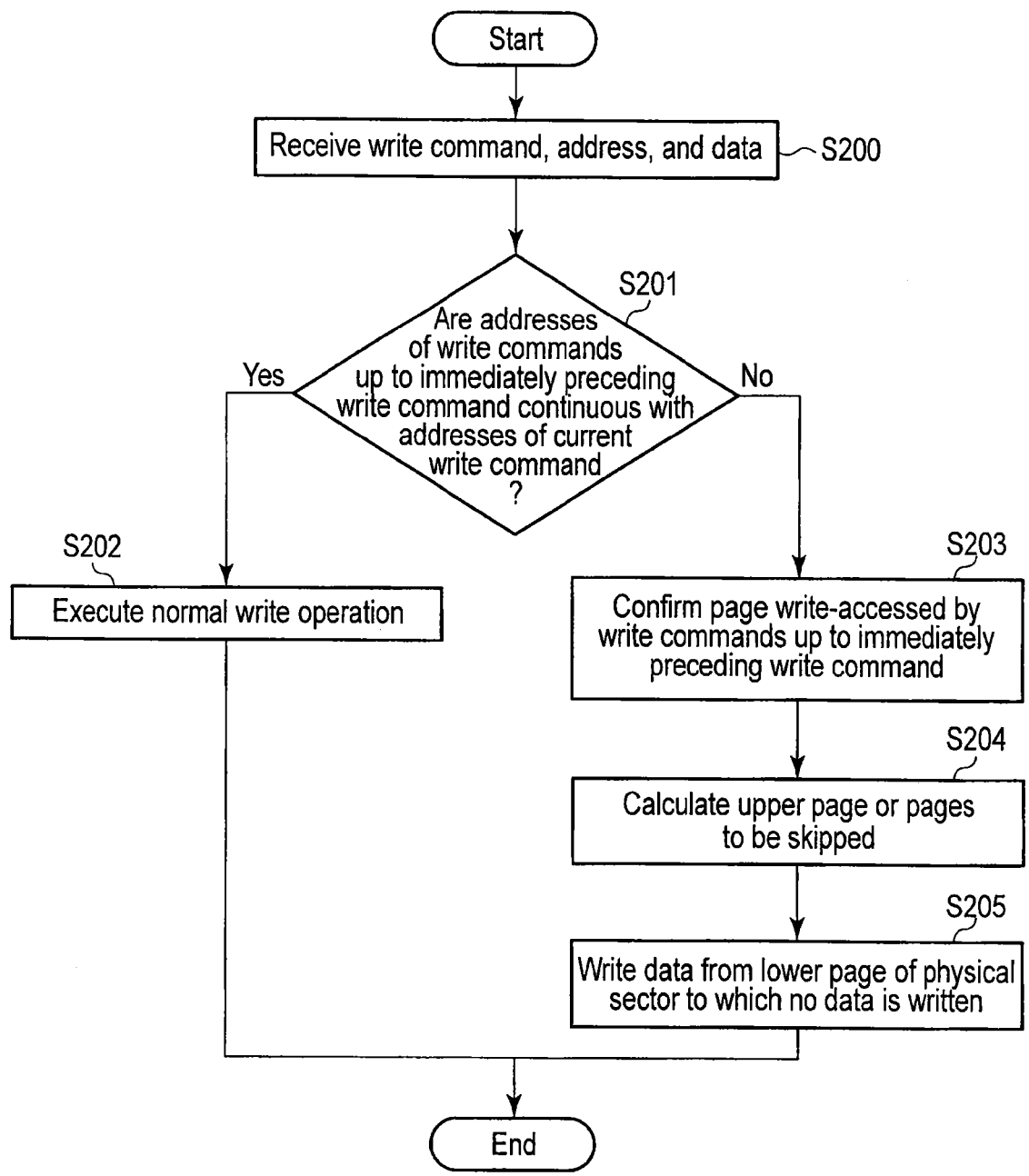
FIG. 9 is a flowchart showing the write operation of a memory card according to the second embodiment.

FIG. 9 is a flowchart showing the write operation of a memory card 20 according to the second embodiment.

A controller 22 receives a write command, address, and write data from a host device 10 (step S200). The controller 22 interprets the write command from the host device 10.

Subsequently, the controller 22 looks up a management table 31 loaded in a RAM 26 to determine whether the logical addresses associated with the immediately preceding write command or the write commands up to the immediately preceding write command are continuous with the logical addresses associated with the current write command (step S201). When it is determined in step S201 that the logical addresses are continuous, the controller 22 performs the normal write operation for the current write command (step S202). More specifically, the controller 22 writes the data by the current write command in accordance with the physical page address order. At this time, the controller 22 does not skip an upper page.

When it is determined in step S201 that the logical addresses are not continuous, the controller 22 executes processes in steps S203 to S205. Steps S203 to S205 are the same as steps S101 to S103 described in the first embodiment. At this time, the controller 2 skips an upper page or pages.

As described above, according to the second embodiment, when the logical addresses associated with the immediately preceding write command or the write commands up to the immediately preceding write command are continuous with the logical addresses associated with the current write command, the controller 22 is configured not to skip the upper page and executes the normal write operation. This makes it possible to reduce the number of skipped pages. As compared with the first embodiment, more data can be written to one block BLK. Two data having the continuous logical addresses can be data obtained by dividing a single file at a high possibility. Even if the memory card 20 is powered off during data write and one data written before the other data of the two data whose logical addresses are continuous is destroyed, only one file is destroyed. Data reliability can be prevented from being greatly reduced. In this case, the host device 10 retransmits the write target file from the beginning to the memory card 20.

When the logical addresses associated with the immediately preceding write command or the write commands up to the immediately preceding write command are not continuous with the logical addresses associated with the current write command, the controller 22 skips the upper page of the physical sector whose lower page is write-accessed by the immediately preceding write command or the write commands up to the immediately preceding command. As in the first embodiment, even if the memory card 20 is powered off during data write to the NAND flash memory 21, the data written previously by another write command will not be destroyed.

In each embodiment described above, the multi level NAND flash memory has been exemplified to store 2-bit data in one memory cell. However, the embodiments are not limited this. Each embodiment described above can be applied even when data of 3 or more bits is stored.

Each embodiment described above has exemplified the NAND flash memory as the nonvolatile semiconductor storage device. However, the embodiments are not limited to this. Another nonvolatile semiconductor storage device can be applied to each embodiment described above as far as the nonvolatile semiconductor storage device stores data of two or more bits in one memory cell.

The above embodiments are not limited to the memory card. A memory system and a host device may be configured as one LSI (Large-Scale Integrated circuit). That is, the controller and nonvolatile semiconductor memory which configure a memory system may be mounted on a printed circuit board on which a host device is mounted.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A storage device comprising:
a nonvolatile memory including physical sectors each of which comprises memory cells commonly connected to a word line, each of the memory cells being capable of storing data of not less than 2 bits, each of the physical sectors including pages corresponding to the number of bits storable in the memory cell, the pages including a lower page and an upper page; and
a controller configured to receive a first write command from the outside of the storage device and to write data associated with the first write command to the nonvolatile memory,
wherein in a write process using the first write command, the controller is configured to skip an upper page of a physical sector whose lower page is write-accessed by a second write command prior to the first write command.

2. The device of claim 1, wherein the controller is configured to skip an upper page of a first physical sector whose lower page is write-accessed by the second write command and to write data associated with the first write command to a second physical sector whose lower page is not write-accessed.

3. The device of claim 1, wherein the controller executes a write process using a management table indicating a correspondence relationship between a logical address and a physical page address.

4. The device of claim 1, wherein when continuously writing page data to the nonvolatile memory, the controller writes data to an upper page of a first physical sector after data is written to a lower page of a second physical sector adjacent to the first physical sector.

5. The device of claim 1, wherein the memory cell includes a charge storage layer and stores data in accordance with charges stored in the charge storage layer.

6. The device of claim 1, wherein the nonvolatile memory comprises a NAND flash memory.

7. A storage device comprising:
a nonvolatile memory including physical sectors each of which comprises memory cells commonly connected to a word line, each of the memory cells being capable of storing data of not less than 2 bits, each of the physical sectors including pages corresponding to the number of bits storable in the memory cell, the pages including a lower page and an upper page; and a controller configured to receive a first write command from the outside of the storage and to write data associated with the first write command to the nonvolatile memory, wherein in a write process using the first write command, the controller is configured to skip an upper page of a physical sector whose lower page is write-accessed by a second write command prior to the first write command when a first address associated with the first write command is not continuous with a second address associated with the second write command, and the controller is configured not to skip an upper page of a physical sector whose lower page is write-accessed by the second write command when the first address is continuous with the second address.

8. The device of claim 7, wherein the controller is configured to skip an upper page of a first physical sector whose lower page is write-accessed by the second write command and to write data associated with the first write command to a second physical sector whose lower page is not write-accessed.

9. The device of claim 7, wherein the controller executes a write process in a physical page address order when the first address is continuous with the second address.

10. The device of claim 7, wherein the controller executes a write process using a management table indicating a correspondence relationship between a logical address and a physical page address.

11. The device of claim 7, wherein when continuously writing page data to the nonvolatile memory, the controller writes data to an upper page of a first physical sector after data is written to a lower page of a second physical sector adjacent to the first physical sector.

12. The device of claim 7, wherein the memory cell includes a charge storage layer and stores data in accordance with charges stored in the charge storage layer.

13. The device of claim 7, wherein the nonvolatile memory comprises a NAND flash memory.

14. A control method of a nonvolatile memory including physical sectors each of which comprises memory cells commonly connected to a word line, each of the memory cells being capable of storing data of not less than 2 bits, each of the physical sectors including pages corresponding to the number of bits storable in the memory cell, the pages including a lower page and an upper page, the method comprising:

receiving a first write command from the outside and writing data associated with the first write command to the nonvolatile memory; and in a write process using the first write command, skipping an upper page of a physical sector whose lower page is write-accessed by a second write command prior to the first command.

15. The method of claim 14, further comprising:

skipping an upper page of a first physical sector whose lower page is write-accessed by the second write commands; and writing data associated with the first write command to a second physical sector whose lower page is not write-accessed.

16. The method of claim 14, wherein a write process using the first write command uses a management table indicating a correspondence relationship between a logical address and a physical page address.

17. The method of claim 14, further comprising, when continuously writing page data to the nonvolatile memory, writing an upper page of a first physical sector after data is written to a lower page of a second physical sector adjacent to the first physical sector.

18. The method of claim 14, wherein the memory cell includes a charge storage layer and stores data in accordance with charges stored in the charge storage layer.

19. The method of claim 14, wherein the nonvolatile memory comprises a NAND flash memory.

* * * * *